(12) United States Patent
Matsuno

(10) Patent No.: US 10,361,665 B2
(45) Date of Patent: Jul. 23, 2019

(54) SEMICONDUCTOR INTEGRATED CIRCUIT, COMMUNICATION MODULE, AND SMART METER

(71) Applicant: Renesas Electronics Corporation, Tokyo (JP)

(72) Inventor: Noriaki Matsuno, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/881,207

(22) Filed: Jan. 26, 2018

(65) Prior Publication Data

US 2018/0152153 A1    May 31, 2018

Related U.S. Application Data

(63) Continuation of application No. 15/043,593, filed on Feb. 14, 2016, now Pat. No. 9,923,525.

(30) Foreign Application Priority Data

Mar. 12, 2015    (JP) ................. 2015-049068

(51) Int. Cl.
*H03F 1/52*    (2006.01)
*H03F 3/195*    (2006.01)
*H01L 27/02*    (2006.01)
*H03F 1/56*    (2006.01)
*H03F 3/24*    (2006.01)

(52) U.S. Cl.
CPC ........... *H03F 1/52* (2013.01); *H01L 27/0255* (2013.01); *H01L 27/0296* (2013.01); *H03F 1/565* (2013.01); *H03F 3/195* (2013.01); *H03F 3/245* (2013.01); *H03F 2200/222* (2013.01); *H03F 2200/294* (2013.01); *H03F 2200/387* (2013.01); *H03F 2200/444* (2013.01);
(Continued)

(58) Field of Classification Search
CPC ............. H03F 1/52; H03F 1/523; H03F 1/526
USPC ............................................. 330/207 P, 298
See application file for complete search history.

(56) References Cited

U.S. PATENT DOCUMENTS 7,010,279 B2    3/2006    Rofougaran
2003/0137383 A1    7/2003    Yang et al.
(Continued)

FOREIGN PATENT DOCUMENTS

JP    2004-079717 A    3/2004
JP    2010-083224 A    4/2010
(Continued)

OTHER PUBLICATIONS

Office Action dated Aug. 14, 2018, in Japanese Patent Application No. 2015-049068.

*Primary Examiner* — Steven J Mottola
(74) *Attorney, Agent, or Firm* — Shapiro, Gabor and Rosenberger, PLLC

(57) ABSTRACT

A semiconductor integrated circuit includes a low-noise amplifier circuit, a transformer, and an ESD protection circuit. The low-noise amplifier circuit amplifies a radio signal that is supplied to an input terminal. The transformer includes a first winding and a second winding and functions as an input impedance matching circuit for the low-noise amplifier circuit, in which at least one end of the second winding is connected to the input terminal of the low-noise amplifier circuit. The ESD protection circuit is connected to a center tap of the first winding.

11 Claims, 16 Drawing Sheets

(52) U.S. Cl.
    CPC .. *H03F 2200/451* (2013.01); *H03F 2200/534* (2013.01); *H03F 2200/541* (2013.01)

(56) References Cited

U.S. PATENT DOCUMENTS

| | | | |
|---|---|---|---|
| 2004/0102175 | A1 | 5/2004 | Rofougaran |
| 2004/0257743 | A1 | 12/2004 | Chen et al. |
| 2011/0002076 | A1 | 1/2011 | Sakai |
| 2011/0049672 | A1 | 3/2011 | Okushima et al. |
| 2011/0267725 | A1 | 11/2011 | Scuderi et al. |
| 2014/0273825 | A1* | 9/2014 | Sapone ................. H01L 23/60 455/41.1 |
| 2016/0126725 | A1 | 5/2016 | Khazhinsky et al. |

FOREIGN PATENT DOCUMENTS

| | | |
|---|---|---|
| JP | 2011-014719 A | 1/2011 |
| JP | 2011-49235 A | 3/2011 |

\* cited by examiner

SEMICONDUCTOR INTEGRATED CIRCUIT, COMMUNICATION MODULE, AND SMART METER

CROSS-REFERENCE TO RELATED APPLICATIONS

This application is a continuation of application Ser. No. 15/043,593 filed Feb. 14, 2016, which is now U.S. Pat. No. 9,923,525. This application is based upon and claims the benefit of priority from Japanese patent application No. 2015-049068, filed on Mar. 12, 2015, the disclosure of which is incorporated herein in its entirety by reference.

BACKGROUND

The present invention to a semiconductor integrated circuit, a communication module, and a smart meter, and to, for example, a semiconductor integrated circuit, a communication module, and a smart meter which include an ESD protection circuit.

In recent years, a wireless communication apparatus capable of transmitting and receiving a high-frequency signal has been widely used. In such a radio communication apparatus, an ESD protection circuit for protecting a circuit element from ESD (Electro Static Discharge) is provided. For example, Japanese Unexamined Patent Application Publication No. 2011-49235 discloses a semiconductor apparatus including an ESD protection circuit for protecting a circuit element from electrostatic discharge.

SUMMARY

In recent years, a semiconductor integrated circuit used in a radio communication apparatus has been further miniaturized. An ESD protection circuit for protecting a circuit element from electrostatic discharge is provided in the semiconductor integrated circuit. However, the present inventor has found a problem that the large size of the ESD protection circuit becomes an obstacle to miniaturization of the semiconductor integrated circuit.

Other problems of the related art and new features of the present invention will become apparent from the following descriptions of the specification and attached drawings.

An aspect of the present invention is a semiconductor integrated circuit that includes a transformer and an ESD protection circuit. The ESD protection circuit is connected to a center tap of a winding of the transformer.

According to the above aspects, a semiconductor integrated circuit including an ESD protection circuit can be miniaturized.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

A smart meter according to a first embodiment shall be explained by referring to FIG. 1 as follows.

[Configuration of Smart Meter: FIG. 1]

Figure 1:
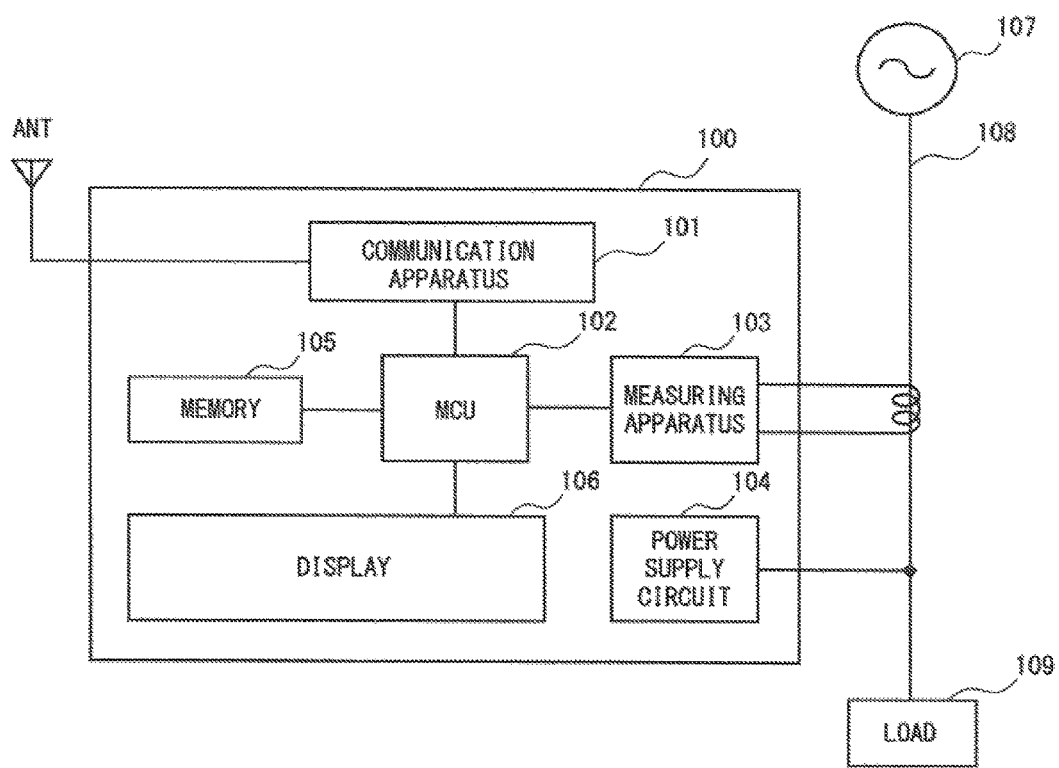
FIG. 1 is a block diagram for explaining a smart meter according to a first embodiment.

FIG. 1 is a block diagram for explaining a smart meter according to this embodiment. As shown in FIG. 1, a smart meter 100 according to this embodiment includes a communication apparatus 101, an MCU (Microcontroller Unit) 102, a measuring apparatus 103, a power supply circuit 104, a memory 105, a display 106, and an antenna ANT. The smart mates 100 is an apparatus for measuring an amount of electricity supplied to a load 109 of a domestic power supply from a commercial power supply 107.

The communication apparatus 101 sends information on the amount of electricity and the like that have been measured by the smart meter 100 to another device via the antenna ANT. Further, the communication apparatus 101 receives predetermined information from the other device via the antenna ANT. The MCU (102) controls the communication apparatus 101, the measuring apparatus 103, the memory 105, and the display 106. The measuring apparatus 103 measures an amount of electricity flowing through a line 108 and outputs information regarding the measured amount of electricity to the MCU (102). The MCU (102) stores the information regarding the measured amount of electricity that has been measured by the measuring apparatus 103 in the memory 105. The memory 105 can be comprised of, for example, a DRAM (Dynamic Random Access Memory). The display 106 displays various information on the smart meter 100. For example, a liquid crystal display can be used for the display 106. For example, the communication apparatus 101 sends a record of electricity consumption that is stored in the memory 105 at the time of reading a meter or communicating with an HEMS (Home Energy Management System).

Figure 2:
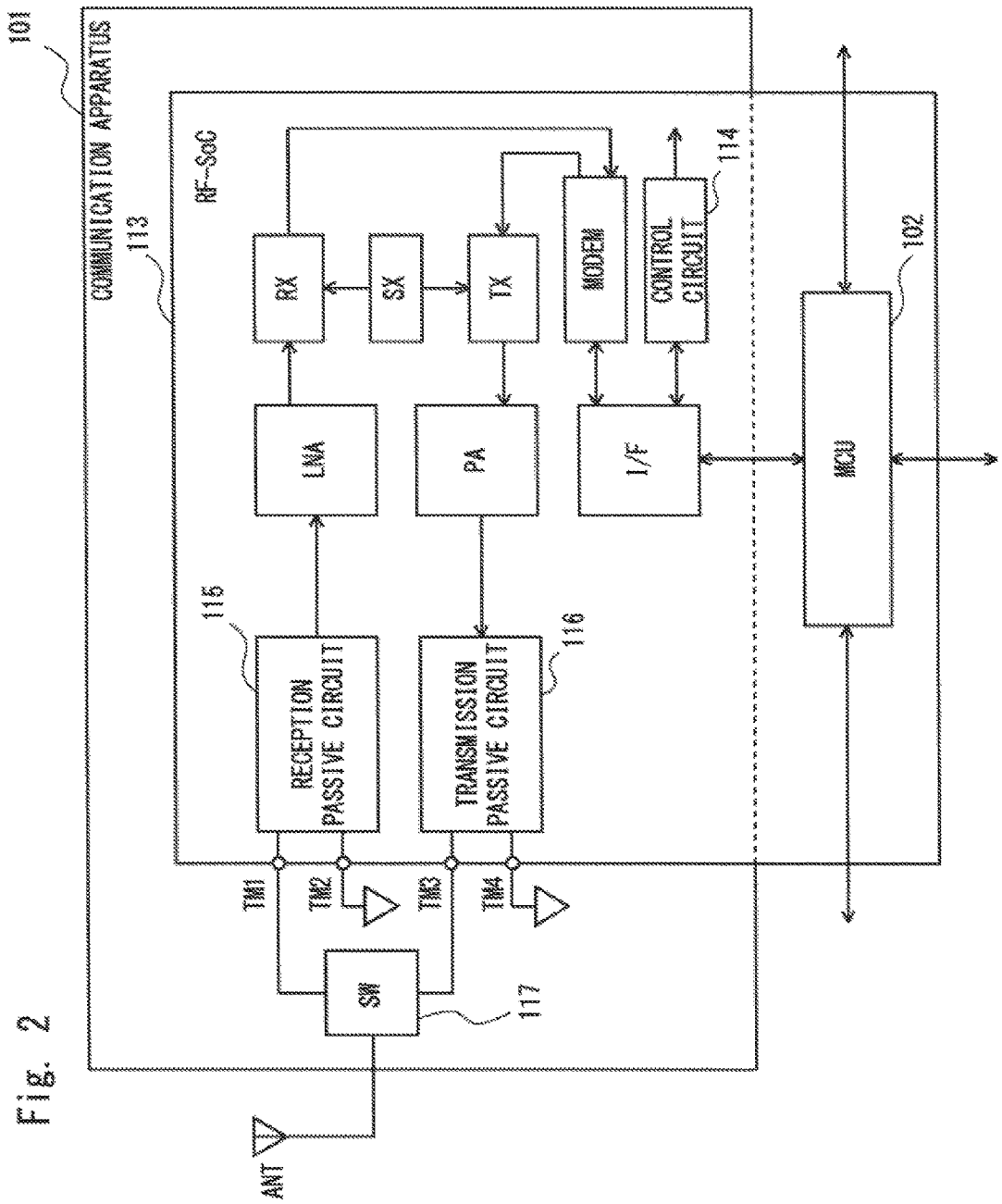
FIG. 2 is a block diagram showing an example of a communication apparatus included in the smart meter shown in FIG. 1.

[Configuration of Communication Apparatus: FIG. 2]

FIG. 2 is a block diagram showing an example of the communication apparatus 101 that is used by the smart meter 100 shown in FIG. 1. As shown in FIG. 2, the communication apparatus 101 includes a semiconductor integrated circuit 113. The semiconductor integrated circuit 113 is an integrated circuit for high frequencies and comprised of a semiconductor chip. The semiconductor integrated circuit 113 includes a reception passive circuit 115, a low-noise amplifier circuit LNA, a receiver circuit RX, a transmitter circuit TX, a transmission amplifier circuit PA, a transmission passive circuit 116, a local oscillator SX, a modem MODEM, a control circuit 114, and an interface I/F. Further, an MCU (102) is integrated into the semiconductor 113, and the semiconductor integrated circuit 113 is comprised of one semiconductor chip (RF-SoC (Radio Frequency System on Chip)). Note that the communication apparatus 101 may be comprised of a semiconductor chip (RF-IC (Radio Frequency Integrated Circuit)) in which the MCU (102) is not mounted on the semiconductor integrated circuit 113. The communication apparatus 101 includes a switch circuit 117. This switch circuit 117 is provided outside the semiconductor integrated circuit 113 (RF-SoC).

The reception passive circuit 115 has a function to match an input impedance of the low-noise amplifier circuit LNA and a function as a filter circuit. The low-noise amplifier circuit LNA amplifies a radio signal (a radio signal input via the antenna ANT) that is supplied from the reception passive circuit 115. The receiver circuit RX performs a reception process such as a down conversion on the reception signal that has been amplified by the low-noise amplifier circuit LNA. The modem MODEM demodulates the reception signal that has been supplied from the receiver circuit RX and supplier the demodulated reception signal to the MCU (102) via the interface I/F.

Further, a transmission signal is supplied from the MCU (102) to the modem MODEM via the interface I/F. The modem MODEM modulates the supplied transmission signal and supplies the modulated transmission signal to the transmitter circuit TX. The transmitter circuit TX performs a transmission process such as an up-conversion on the modulated transmission signal that has been supplied from the modem MODEM. The transmission amplifier circuit PA amplifies the transmission signal that has been supplied from the transmitter circuit TX. The transmission passive circuit 116 has a function to match an output impedance of the transmission amplifier circuit PA and a function as a filter circuit.

The switch circuit 117 switches between a connection of the antenna ANT and the reception passive circuit 115 and a connection of the antenna ANT and the transmission passive circuit 116. More specifically, the switch circuit 117 connects the antenna and the reception passive circuit 115 at the time of a reception and connects the antenna node ANT and the reception passive circuit 116 at the time of a transmission. Moreover, a control signal is supplied to the control circuit 114 from the MCU (102) via the interface I/F.

The control circuit 114 controls the communication apparatus 101 in response to the control signal.

[Explanation of Related Art]

Figure 12:
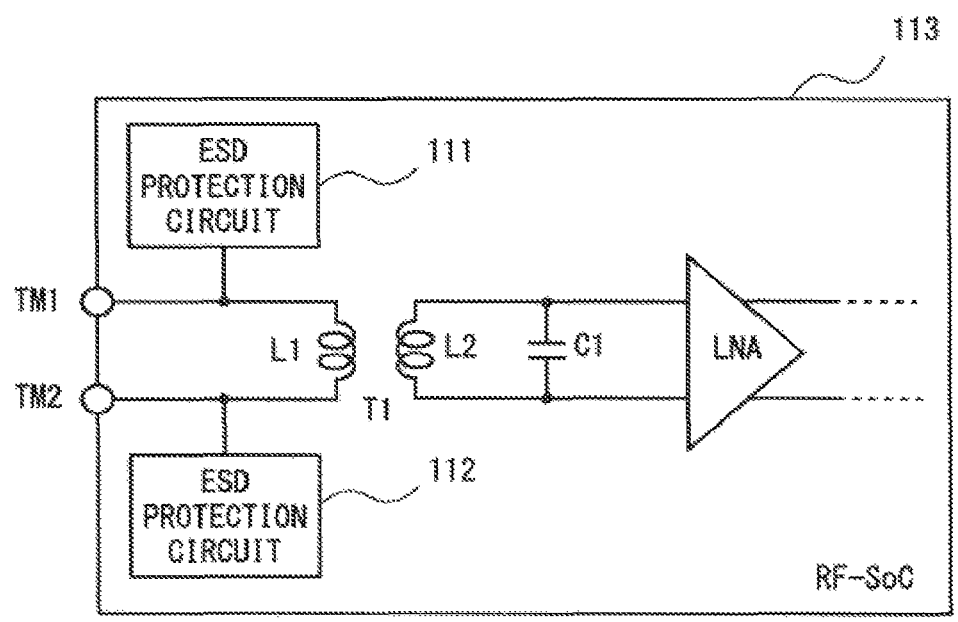
FIG. 12 is a drawing for explaining a semiconductor integrated circuit according to the related art.

Next, the communication apparatus 101 according to related art shown in FIG. 2 shall be explained as follows by referring to FIGS. 12 to 16. FIG. 12 is a circuit diagram for explaining the semiconductor integrated circuit 113 included in the communication apparatus 101 according to the related art shown in FIG. 2. As shown in FIG. 12, the semiconductor integrated circuit 113 includes a transformer T1 including terminals TM1 and TM2 and windings L1 and L2, a capacitive element C1, a low-noise amplifier LNA, and ESD protection circuits 111 and 112. The transformer T1 and the capacitive element C1 function as an input impedance matching circuit for the low-noise amplifier circuit LNA. The capacitive element C1 may be omitted depending on a value of an input impedance of the low-noise amplifier circuit LNA. Note that in FIG. 12, receiver and transmitter circuits, terminals TM3 and TM4 and the like in the subsequent stages of the low-noise amplifier circuit LNA are not shown.

As shown in FIG. 12, one end of the winding L1 of the transformer T1 is connected to the terminal TM1, and the other end of the winding L1 of the transformer T1 is connected to the terminal TM2. The ESD protection circuit 111 is connected to the one end of the winding L1 of the transformer T1 (the terminal TM1). The ESD protection circuit 112 is connected to the other end of the winding L1 of the transformer T1 (the terminal TM2).

Figure 13:
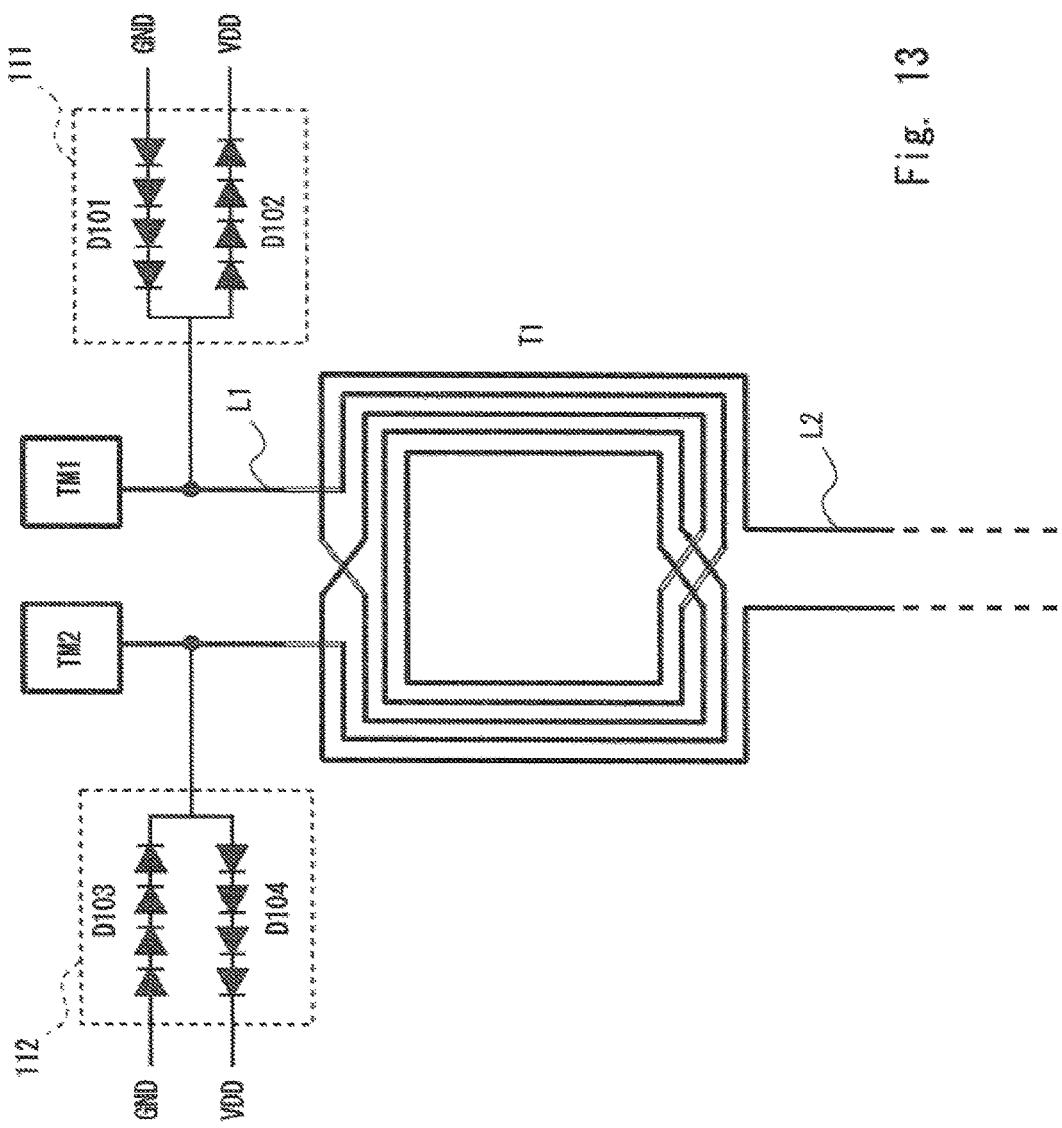
FIG. 13 is a drawing showing a specific configuration example of a transformer and an ESD protection circuit that are included in the semiconductor integrated circuit shown in FIG. 12.

FIG. 13 is a drawing showing a specific configuration example of the transformer T1 and the ESD protection circuits 111 and 112 that are included in the semiconductor integrated circuit 113 shown in FIG. 12. As shown in FIG. 13, the one end of the winding L1 of the transformer T1 is connected to the terminal (an input pad) TM1, and the other end of the winding L1 of the transformer T1 is connected to the terminal (an input pad) TM2. The winding L1 is disposed spirally around a central axis. Further, the winding L2 of the transformer T1 is also disposed spirally around the central axis that is common to the winding L1. By disposing the windings in this way, the windings L1 and 12 can be magnetically coupled. The windings L1 and L2 can be formed by using spiral inductors formed on a semiconductor substrate.

The ESD protection circuit 111 is connected to the one end of the winding L1. The ESD protection circuit 111 can be comprised of two diode groups D101 and D102 connected in parallel to each other, in which the diode groups D101 and D102 each include a plurality of diodes connected in multiple stages. To be more specific, the anode side of the diode group D101 is connected to a ground potential GND, and the cathode side of the diode group D101 is connected to the one end of the winding L1. Further, the cathode side of the diode group D102 is connected to a power supply potential VDD, and the anode side of the diode group D102 is connected to the one end of the winding L1.

Similarly, the ESD protection circuit 112 is connected to the other end of the winding L1. The ESD protection circuit 112 can be comprised of two diode groups D103 and D104 connected in parallel to each other, in which the diode groups D103 and D104 each include a plurality of diodes connected in multiple stages. To be more specific, the anode side of the diode group D103 is connected to the ground potential GND, and the cathode side of the diode group D103 is connected to the other end of the winding L1. Further, the cathode side of the diode group D104 is connected to the power supply potential VDD, and the anode aide of the diode group D104 is connected to the other end of the winding L1.

[Usage Example of Semiconductor Integrated Circuit (RF-SoC)]

Figure 14:
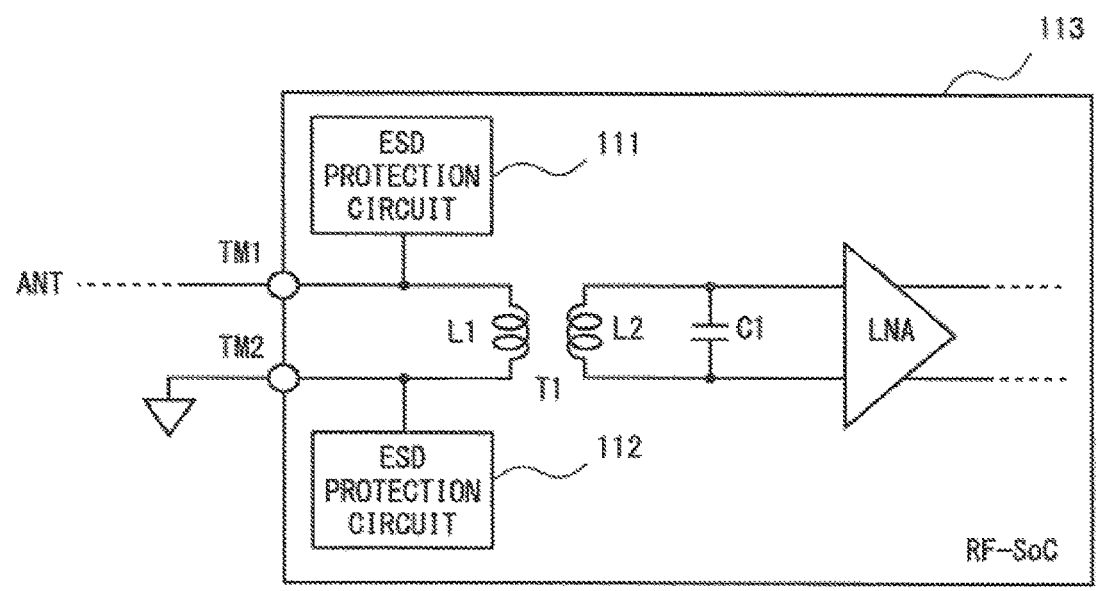
FIG. 14 is a circuit diagram for explaining a usage example of the semiconductor integrated circuit shown in FIG. 12.

Next, a usage example of the semiconductor integrated circuit 113 shown in FIG. 12 shall be explained as follows. FIG. 14 is a circuit diagram for explaining the usage example of the semiconductor integrated circuit shown in FIG. 12. In the usage example shown in FIG. 14, a reception signal is supplied to the terminal. TM1 from the antenna ANT, and the terminal TM2 is grounded. This usage example corresponds to a usage example of the semiconductor integrated circuit 113 shown in FIG. 2. The reception signal supplied from the antenna ANT is a single-phase signal, and the transformer T1 converts this single-phase signal into a differential signal. As the receiver circuit in the subsequent stages of the transformer T1 has a configuration for handling such a differential signal, the configuration has robustness to noise in comparison to a configuration for handling a single-phase signal.

Moreover, in the usage example shown in FIG. 14, the other end of the winding L1 of the transformer T1 is grounded via the terminal TM2. That is, the other end of the winding L1 of the transformer T1 is grounded outside the semiconductor integrated circuit 113. Such a configuration can prevent common mode noise applied to the winding L1 of the transformer T1 from entering the receiver circuit, a power supply node, or a ground node that are in the subsequent stages of the transformer T1.

Figure 15:
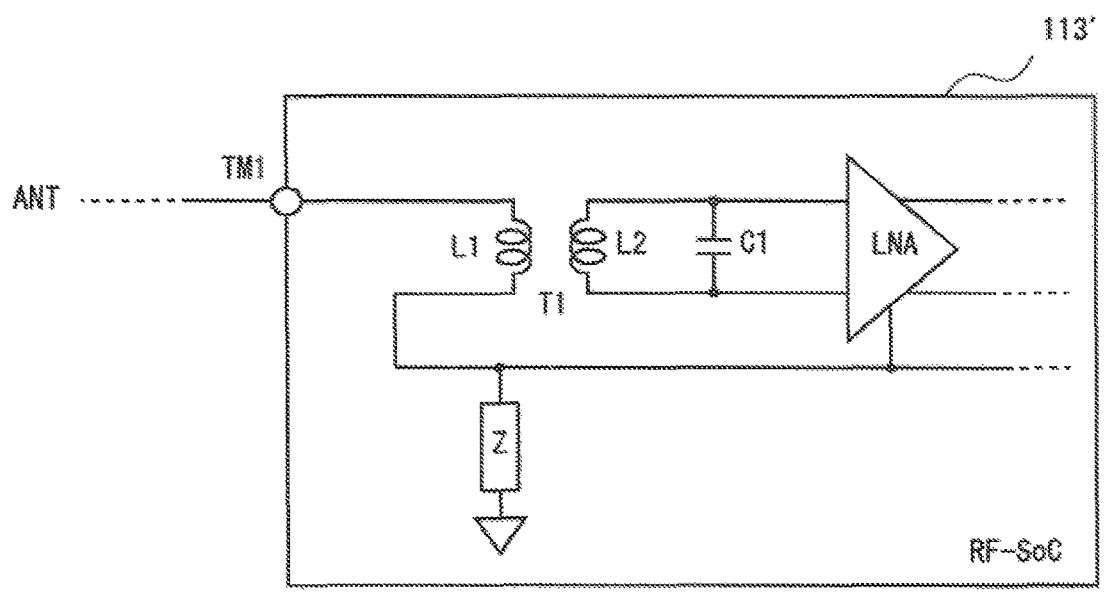
FIG. 15 is a circuit diagram for explaining another configuration example of the semiconductor integrated circuit shown in FIG. 12.

As in, for example, a semiconductor integrated circuit 113' shown in FIG. 15, when the other end of the winding L1 of the transformer T1 is connected to a ground node of the semiconductor integrated circuit 113', by the common mode noise applied to the winding L1 passing through a common impedance Z of a ground inside the semiconductor integrated circuit 113', the common mode noise enters the ground node inside the semiconductor integrated circuit 113'. On the other hand, as shown in FIG. 14, when the other end of the winding L1 of the transformer T1 is grounded outside the semiconductor integrated circuit 113, it is possible to prevent the common mode noise from entering the ground node inside the semiconductor integrated circuit 113.

Figure 16:
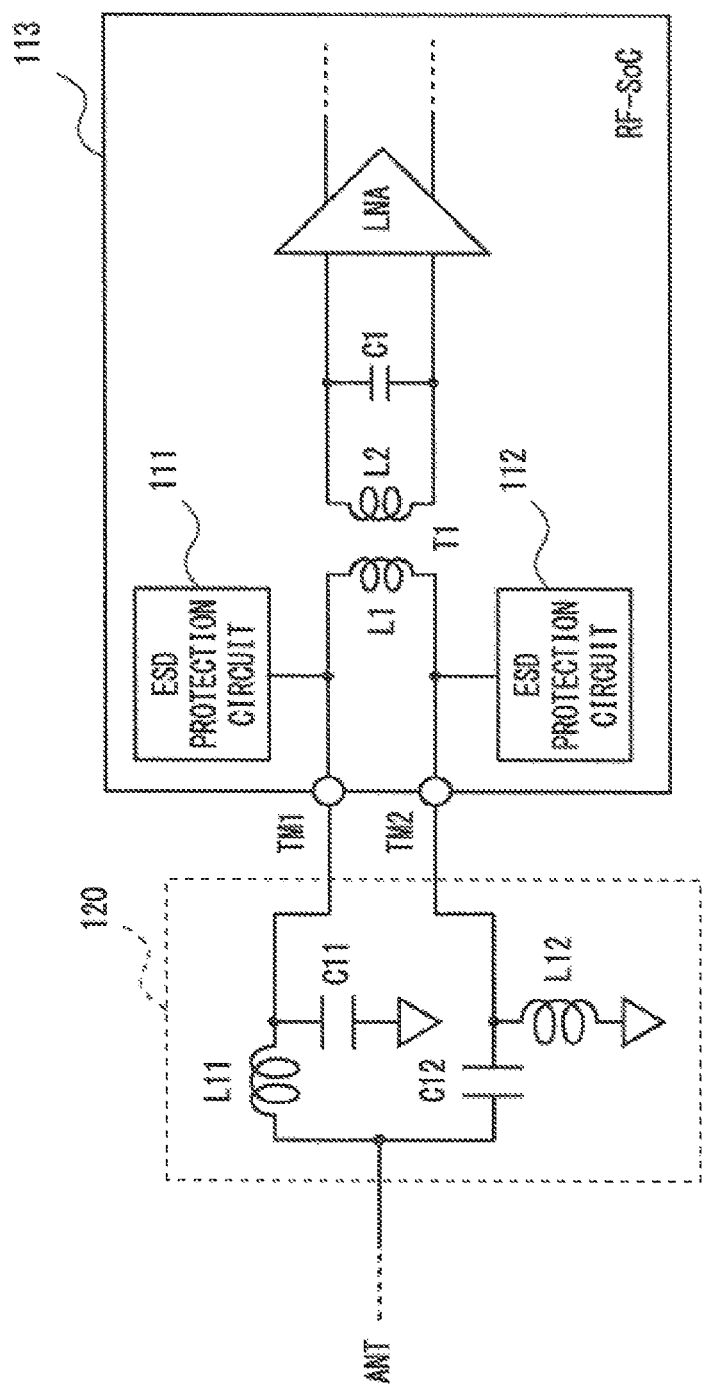
FIG. 16 is a circuit diagram for explaining another configuration example of the semiconductor integrated circuit shown in FIG. 12.

FIG. 16 is a circuit diagram for explaining another usage example of the semiconductor integrated circuit 113 shown in FIG. 12. In a usage example of FIG. 16, a single-phase reception signal supplied from the antenna ANT is converted into a differential signal by an external LC circuit 120 and then input to the semiconductor integrated circuit 113. The LC circuit 120 can be comprised of, for example, inductors L11 and L12 and capacitive elements C11 and C12.

The LC circuit. 120 is provided, for example, between the switch circuit 117 and the terminals T1 and T2 of the communication apparatus 101 shown in FIG. 2. Note that the LC circuit 120 for converting a single-phase signal into a differential signal should only be disposed in a signal path from the antenna ANT to the semiconductor integrated circuit 113, and it is not necessary to dispose the LC circuit 120 proximate to the semiconductor integrated circuit 113. In the usage example shown in FIG. 16, as the differential signal is supplied to the terminals TM1 and TM2 of the semiconductor integrated circuit 113, the configuration shown in FIG. 16 has more robustness to external noise than the configuration of the usage example shown in FIG. 14.

As in the usage examples shown in FIGS. 14 and 16, the semiconductor integrated circuit 113 is configured to support both a single-phase input and a differential phase input. The reason for this shall be explained below.

As a smart meter has been used worldwide, IEEE802.15.4g, which is a communication standard for smart meters, defines a number of communication modes to meet communication regulations in many countries around the world. However as the communication mode that is defined as being the communication mode for smart meters is a narrow band communication, minimum receiver sensitivity is low. More specifically, the minimum receiver sensitivity in a low-speed narrow-band communication mode is about −110 dBm. Further, in a high-speed, wide-band communication mode, the minimum reception sensitivity is about −80 dBm. In general, in the communication mode using weak radio waves, it is desirable to use a semiconductor integrated circuit (RF-IC and RF-SoC) having a differential configuration having robustness to external noise. On the other hand, to reduce a cost of the smart meter, it is desirable to use a semiconductor integrated circuit (RF-IC and RF-SoC) which is a single-phase input and includes an impedance matching circuit. The semiconductor integrated circuit 113 shown in FIG. 12 support both usages explained above.

The number of the communication modes which should be supported by one smart meter is one to several modes at most. Accordingly, it is possible to separately prepare a semiconductor integrated circuit dedicated for a differential input and a semiconductor integrated circuit for a single-phase input and use either of these semiconductor integrated circuits as appropriate. However, in an actual development of the semiconductor integrated circuits, it is difficult to accurately predict the problem of the noise, which prediction is a key to determine whether the single-phase input or differential input is suitable, at a design phase. It is necessary to actually manufacture an apparatus to evaluate as to whether or not the single-phase input is possible or whether or not the differential input is needed. Such an evaluation is required for each destination which the apparatus is developed for. Therefore, when the semiconductor integrated circuit (RF-IC or RF-SoC) that can support both the single-phase input and differential input is prepared, and the semiconductor integrated circuit can switch between the single-phase input and differential input by changing a mounting substrate of the semiconductor integrated circuit and re-mounting chip parts, the development man-hours for the semiconductor integrated circuit can be reduced, consequently reducing the cost of the smart meter. Moreover, when the smart meters for a plurality of destinations are manufactured in parallel, by using the semiconductor integrated circuit (RF-IC or RF-SoC) that supports both the single-phase input and differential input, parts procurement and inventory management costs can be reduced.

[Problem of Related Art]

In the semiconductor integrated circuit 113 shown in FIG. 12, the ESD protection circuits 111 and 112 are provided for the two terminals TM1 and TM2 so as to protect the semiconductor integrated circuit 113 from electrostatic discharge (surge). In general, areas of the ESD protection circuits 111 and 112 are considerably large and greatly increase an area of the semiconductor integrated circuit 113. Therefore, there has been a problem that the semiconductor integrated circuit cannot be miniaturized enough. This problem eventually leads to an increase in the cost of the smart meter.

Furthermore, in general, the ESD protection circuit has a considerably large parasitic capacitance. This parasitic capacitance deteriorates a reception characteristic of the semiconductor integrated circuit and eventually deteriorates the communication quality of the smart meter. This means that the places where the smart meter can be installed become mere limited, thereby increasing a cost of the installation and an operation of the smart meter. As a specific example, a case in which a conventional meter is replaced by a smart meter shall be considered below. Adequate communication quality may not be achieved by only installing the smart meter at a place at which the conventional meter has been installed depending on the place at which the smart meter will be installed. In such a case, it is necessary to adjust the installation position within an allowable range while performing a communication test, and this leads to an increase in personnel expenses involved in the installation of the smart meter. The lower the reception performance of the smart meter, the more such cases occur. As another specific example, a case where a metallic barn which will be an interference for radio waves is built after a smart meter has been installed shall be considered as follows. When the communication quality of the smart meter is not adequate, such a change in the environment caused by the building of the metallic barn will cause a failure in a communication of the smart meter. In such a case, it is necessary to dispatch personnel to perform an investigation and do some work regarding this failure. This leads to an increase in an operational cost of the smart meter. The lower the reception performance of the smart meter, the more such cases occur. A semiconductor integrated circuit that can solve such a problem shall be explained below.

Figure 3:
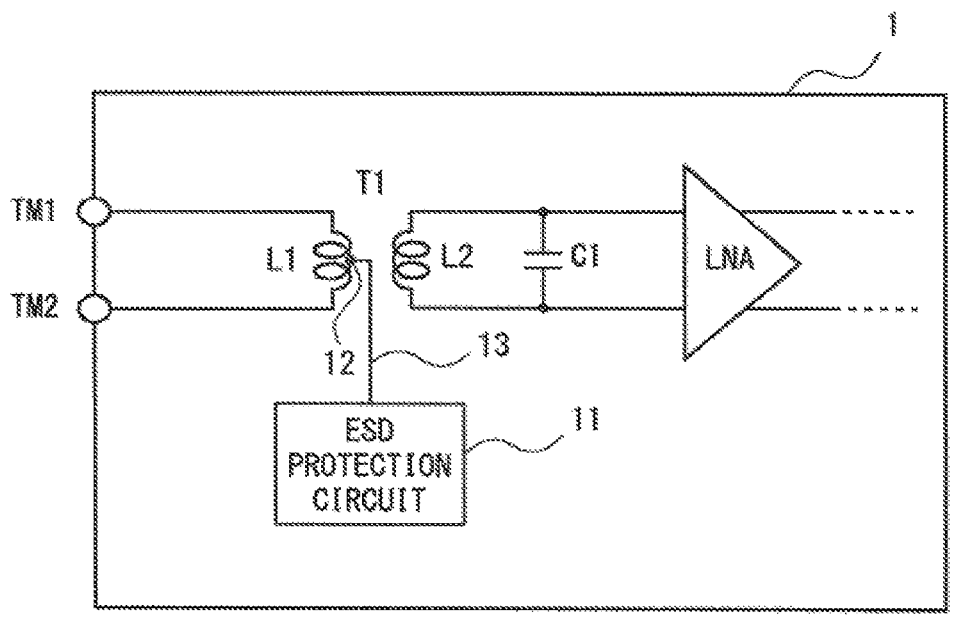
FIG. 3 is a circuit diagram showing an example of a semiconductor integrated circuit according to the first embodiment.
Figure 4:
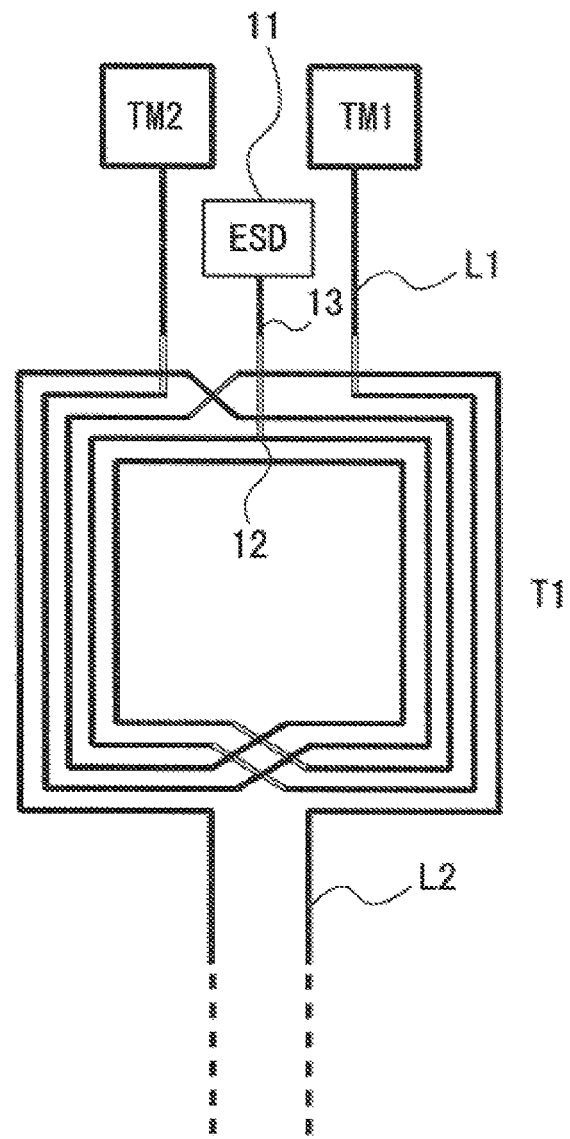
FIG. 4 is a drawing for explaining a configuration example of the semiconductor integrated circuit according to the first embodiment.
Figure 5:
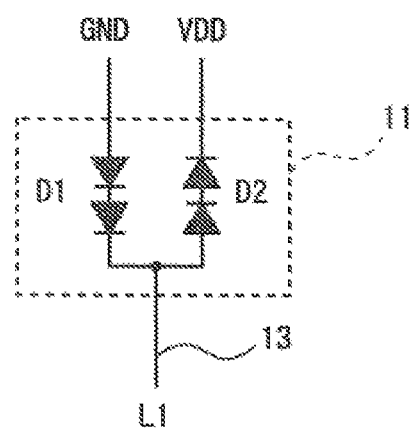
FIG. 5 is a circuit diagram showing as example of an ESD protection circuit.

[Configuration of Semiconductor Integrated Circuit: FIGS. 3 to 5]

FIG. 3 is a circuit diagram showing an example of a semiconductor integrated circuit according to this embodiment. As shown in FIG. 3, a semiconductor integrated circuit 1 according to this embodiment includes a transformer T1 including terminals TM1 and TM2, windings L1 and L2, a capacitive element C1, and a low-noise amplifier circuit LNA. These components are integrated into, for example, RF-IC and RF-SoC. The semiconductor integrated circuit (a receiver circuit) 1 according to this embodiment can be used for, for example, the semiconductor integrated circuit 113 (for receptions in this case) that is included in the communication apparatus 101 shown in FIG. 2. Note that although the configuration example shown in FIG. 2 shows a case in which a single-phase reception signal is supplied to the semiconductor integrated circuit 1, in this embodiment, a differential reception signal may be supplied to the semiconductor integrated circuit 1. In this case, a conversion circuit (e.g. the LC circuit 120 shown in FIG. 16) for converting a single-phase signal into a differential signal is provided for an input side of the semiconductor integrated circuit 1. When the differential reception signal is supplied to the semiconductor integrated circuit 1, the terminals TM1 and TM2 receive the differential signal.

The transformer T1 and capacitive element C1 function as an input impedance matching circuit for the low-noise amplifier circuit LNA. The capacitive element C1 may be omitted depending on a value of an input impedance of the low-noise amplifier circuit LNA. Note that in FIG. 3, the receiver circuit in the subsequent stages of the low-noise amplifier circuit LNA is not shown. The receiver circuit in the subsequent stages of the low-noise amplifier circuit LNA is the same as that in the semiconductor integrated circuit 113 shown in FIG. 2.

As shown in FIG. 3, one end of the winding L1 of the transformer T1 is connected to the terminal. TM1, and the other end of the winding L1 of the transformer T1 is connected to the terminal TM2. A reception signal is supplied to the winding L1 of the transformer T1 via the terminals TM1 and TM2. The ESD protection circuit 11 is connected to a center tap 12 of the winding L1 of the transformer T1 via a line 13.

FIG. 4 is a drawing for explaining a configuration example of the semiconductor integrated circuit 1 shown in FIG. 3. As shown in FIG. 4, the one end of the winding L1 of the transformer T1 is connected to the terminal (an input pad) TM1, and the other end of the binding L1 of the transformer T1 is connected to the terminal (an input pad) TM2. The winding L1 is disposed spirally around a central axis. Further, the winding L2 of the transformer T1 is also disposed spirally around the central axis that is common to the winding L1. By disposing the windings in this way, the windings L1 and L2 can be magnetically coupled. The windings L1 and L2 can be comprised of, for example, spiral inductors formed on a semiconductor substrate.

Additionally, as shown in FIG. 4, the ESD protection circuit 11 is connected to the center tap 12 of the winding L1 of the transformer T1 via the line 13. The ESD protection circuit 11 is disposed outside the winding L1. A position of the center tap 12 of the winding L1 is a position at which lengths from the one and other ends of the winding L1 are equal, i.e., a position at an equal distance from the terminals TM1 and TM2.

Note that in this embodiment, the position of the center tap 12 may be slightly shifted from the position at which the lengths from the one and other ends of the winding L1 are equal. More specifically, when the position at which the lengths from the one and other ends of the winding L1 are equal is a position $P_M$, and a length from the one end to the other end of the winding L1 is L, the center tap may be provided within a range of $\pm L \times 0.1$ (i.e. 10% of L) from the position $P_M$. When the position of the center tap 12 is shifted from the position $P_M$, the parasitic capacitance of the ESD protection circuit 11 will have an influence on a differential signal, and this causes a balance of the differential signal flowing through the transformer T1 to be lost. However, by limiting the position of the center tap 12 within the above-mentioned range, the influence of the parasitic capacitance of the ESD protection circuit 11 on the differential signal can be kept within an allowable range.

FIG. 5 is a circuit diagram showing an example of the ESD protection circuit 11. As shown in FIG. 5, the ESD protection circuit 11 can be comprised of two diode groups D1 and D2 connected in parallel to each other, in which the diode groups D1 and D2 each include a plurality of diodes being connected in multiple stages. To be more specific, the anode side of the diode group D1 is connected to a ground potential GND, and the cathode side of the diode group D1 is connected to the line 13. Further, the cathode side of the diode group D2 is connected to a power supply potential VDD, and the anode side of the diode group D2 is connected to the line 13. In the example shown in FIG. 5, two diodes are connected in series to constitute each of the diode groups D1 and D2. Note that the number of stages of the diodes that are connected in series is a design factor and not limited to two stages. Moreover, the configuration of the element and circuit used for the ESD protection circuit is a design factor and not limited to the diode. In the ESD protection circuit 11 shown in FIG. 5, a plurality of diodes are formed in a range indicated by a dashed line. These diodes correspond to a diode shown in a cross-sectional diagram of FIG. 7 (an explanation of FIG. 7 shall be given later). That is, the ESD protection circuit 11 shown in FIG. 5 schematically illustrates the diode shown in the cross-sectional diagram of FIG. 7 by the circuit diagram.

The electrostatic discharge (surge) that has entered the terminals TM1 end TM2 passes through a half portion of the winding L1 of the transformer T1 and the ESD protection circuit and is discharged to aground (GND) or a power supply (VDD) node. The winding L1 that is connected to the terminals TM1 and TM2 are formed of lines having large cross-section areas in order to reduce a loss of the transformer T1. Therefore, the winding L1 has a cross-section area large enough for a surge current to flow therethrough when the ESD protection circuit operates, and thus a special design change in consideration of the operation of the ESD protection circuit is unnecessary.

As described above, in the semiconductor integrated circuit 1 according to this embodiment, as the number of the ESD protection circuits 11 can be half that in the related art (that is, one), the area necessary for the ESD protection circuit can be half that in the related art. Therefore, the semiconductor integrated circuit including the ESD protection circuit can be miniaturized.

Further, when a reception signal (an RF signal) is supplied to one terminal TM1 from the antenna ANT, and the other terminal TM2 is grounded, an amplitude of the reception signal applied to the ESD protection circuit 11 will become ½ of the amplitude of the reception signal supplied to the terminal TM1. In this case, this further reduces the area of the ESD protection circuit 11.

When a pn junction diode is used for the ESD protection circuit, and an expected amplitude of a reception signal is about three times as great as a forward voltage VF of the pn junction diode with respect to 0 V, the ESD protection circuit used for the semiconductor integrated circuit 113 shown in FIG. 12 requires an ESD protection circuit including four stages of pn junction diodes connected in series (see FIG. 13).

On the other hand, in the semiconductor integrated circuit 1 shown in FIG. 3, an amplitude of a reception signal applied to the ESD protection circuit 11 will become ½ of an amplitude of a reception signal supplied to the terminal TM1. This is about 1.5 times as great as a forward voltage VF of the pn junction voltage. Accordingly, in the semiconductor integrated circuit 1 according to this embodiment, the ESD protection circuit 11 can have a configuration including two stages of pn junction diodes connected in series (see FIG. 5).

Further, when the amplitude of the reception signal applied to the ESD protection circuit 11 becomes ½ of an amplitude of a reception signal supplied to the terminal TM1, the same effect as the effect achieved when a parasitic impedance of the ESD protection circuit 11 is doubled can be achieved. As the ESD protection circuit 11 is connected in parallel to a signal path of an original reception signal, the higher the parasitic impedance, the greater the reduction achieved in an increase of a loss caused by the parasitic impedance and in a deterioration of a frequency characteristic caused by the parasitic capacitance.

Figure 6:
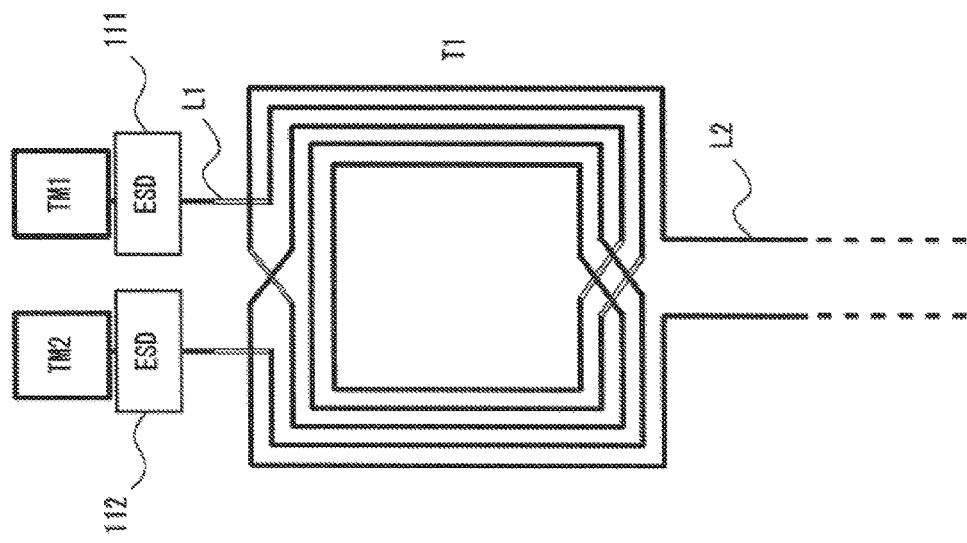
FIG. 6 is a drawing for comparing the semiconductor integrated circuit according to the first embodiment with a semiconductor integrated circuit according to related art.
Figure 6:
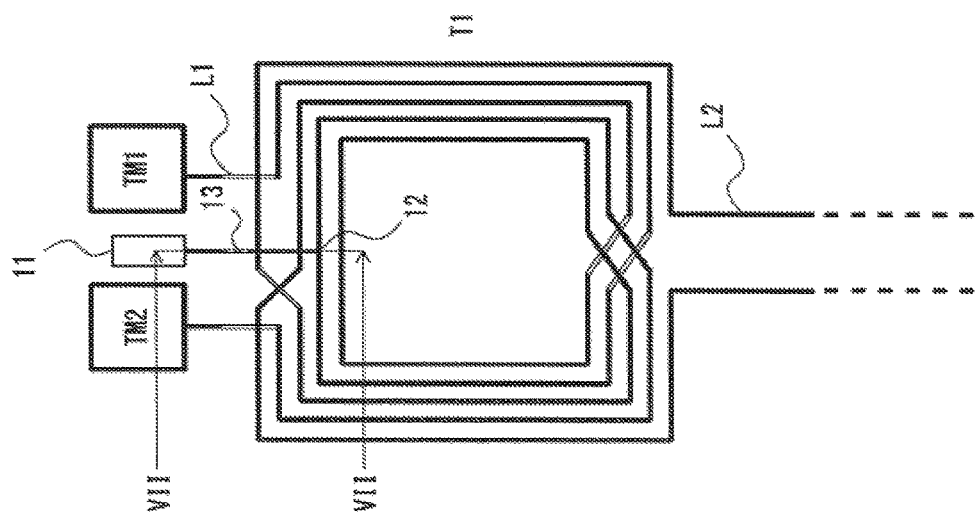

[Comparison with Related Art: FIG. 6]

FIG. 6 is a drawing for comparing the semiconductor integrated circuit 1 according to this embodiment with the semiconductor integrated circuit 113 according to the related art and a configuration example of the terminals TM1 and TM2, the transformer T1, and the ESD protection circuit included in each semiconductor integrated circuit. Note that the components as shown in FIG. 6 correspond to the actual sizes thereof.

As shown in FIG. 6, it is necessary to provide the ESD protection circuits 111 and 112 for each of the terminals TM1 and TM2 in the related art. In the configuration example shown in FIG. 6, the ESD protection circuits 111 and 112 are respectively disposed between the terminals TM1 and TM2 and the transformer T1.

On the other hand, in the semiconductor integrated circuit 1 according to this embodiment, as the ESD protection circuit 11 is connected to the center tap 12 of the winding L1 of the transformer T1, the number of the ESD protection circuits 11 can be one. Accordingly, the area of the ESD protection circuit can be half that in the related art. Further, in the semiconductor integrated circuit 1 according to this embodiment, the amplitude of the reception signal applied to the ESD protection circuit 11 will become ½ of the amplitude of the reception signal supplied to the terminal TM1. Therefore, the number of stages of the diodes constituting the ESD protection circuit 11 can be half that in the related art. Furthermore, in the semiconductor integrated circuit 1 according to this embodiment, as the number of stages of the diodes constituting the ESD protection circuit 11 is half that in the related art, even when the sizes of the diodes are reduced to half those in the related art, a parasitic resistance at the time of ESD discharge can be maintained to be equal to that in the related art In summary, in the semiconductor integrated circuit 1 according to this embodiment, the area of the ESD protection circuit can be ⅛ (=½×½×½) in total in comparison to that in the related art. Accordingly, as shown in FIG. 6, the ESD protection circuit 11 can be disposed between the terminals TM1 and TM2. Consequently, an area of the semiconductor integrated circuit 1 can be reduced.

Figure 7:
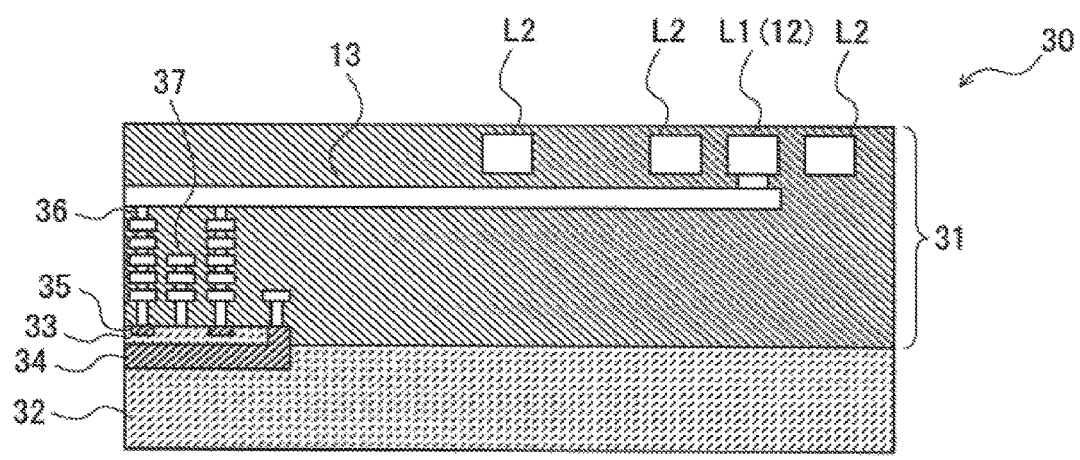
FIG. 7 is a cross-sectional diagram taken along the line VII-VII of FIG. 6.

[Specific Configuration Example (Cross-Section): FIG. 7]

FIG. 7 is a cross-sectional diagram taken along the line VII-VII of FIG. 6 and a cross-sectional diagram of the transformer T1 and the ESD protection circuit 11. The components of the semiconductor integrated circuit 1 according to this embodiment are formed on a semiconductor substrate 30. The windings L1 and L2 of the transformer T1 are formed in a wiring layer 31. As an example, a line width of the windings L1 and L2 is about 5 to 20 μm. The line 13 is connected to the center tap 12 of the winding L1 and provided to extend from the winding L1 side to the ESD protection circuit 11. A line 36 extending in a vertical direction is connected to the line 13.

Further, in order to separate a p-type silicon layer 33 and a p-type silicon layer 32 that constitute the diode, an n-type silicon layer 34 is provided between the p-type silicon layer 32 and the p-type silicon layer 33. The line 36 is connected to an n-type silicon layer 35. The n-type silicon layer 35 and the p-type silicon layer 33 form a pn junction. A line 37 is connected to the p-type silicon layer 33. That is, one diode is formed between the lines 36 and 37. The line 37 is connected to another diode via a line that is formed in the wiring layer 31. In a manner described above, the ESD protection circuit can be comprised of the plurality of diodes that are connected in multiple stages and formed on the semiconductor substrate 20.

Figure 8:
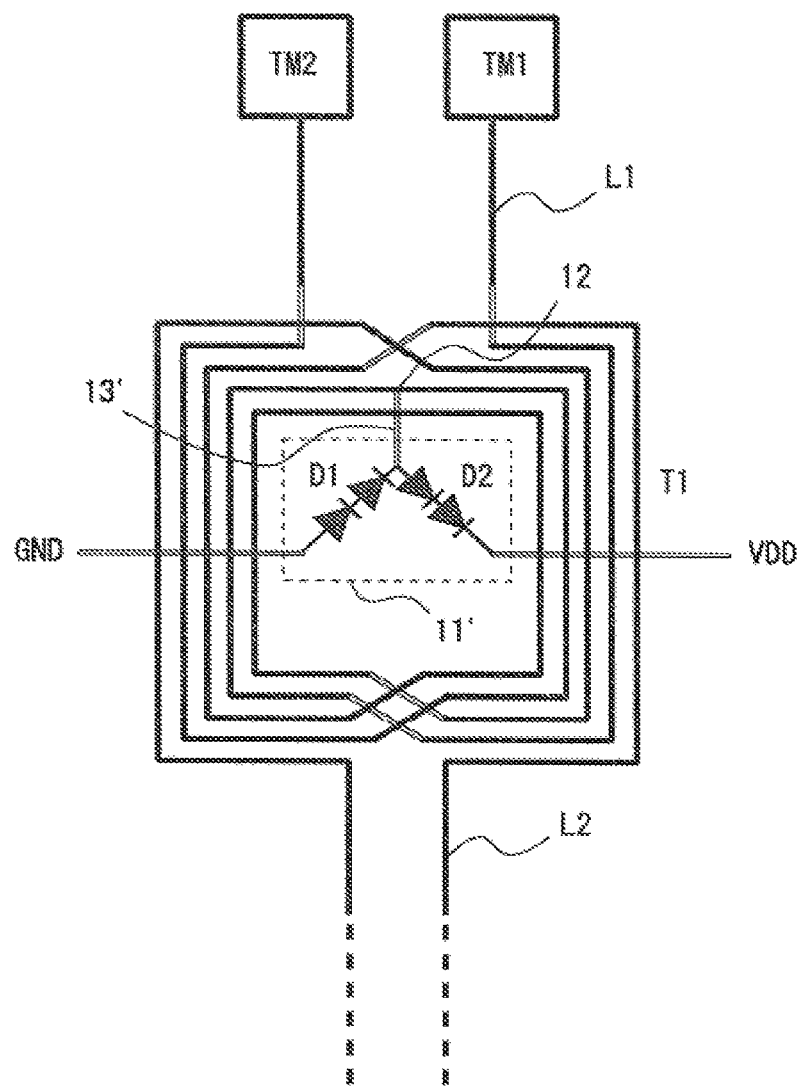
FIG. 8 is a drawing for explaining another configuration example of the semiconductor integrated circuit according to the first embodiment.
Figure 9:
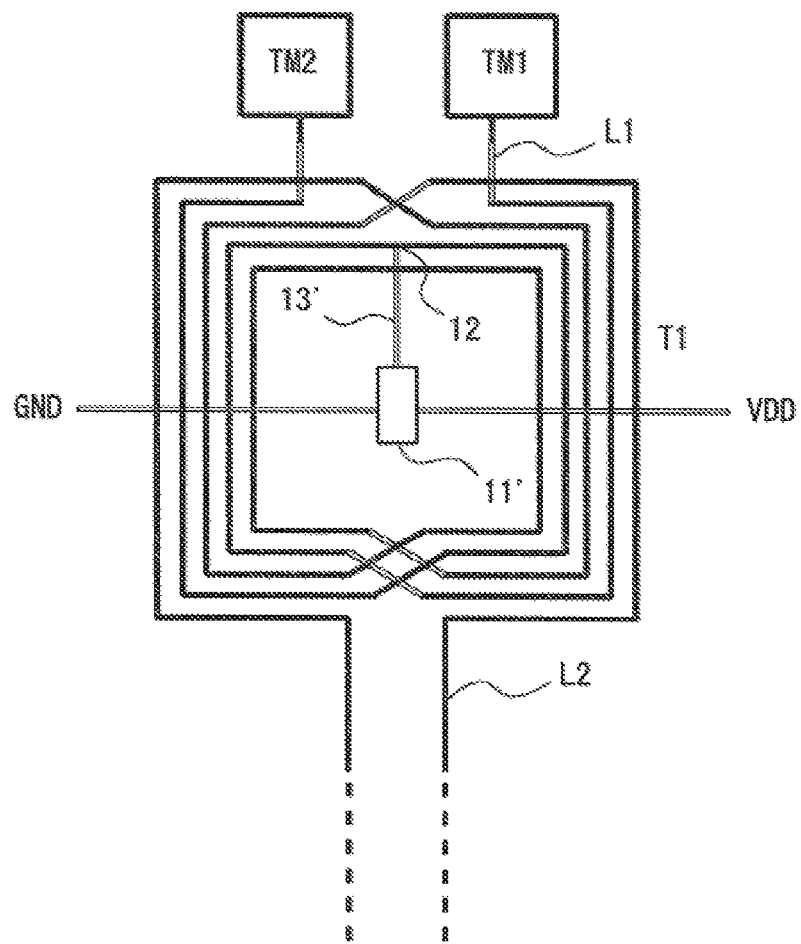
FIG. 9 is a drawing for explaining another configuration example of the semiconductor integrated circuit according to the first embodiment.

[Another Configuration Example of Semiconductor Integrated Circuit: FIGS. 8 and 9]

FIG. 8 is a drawing for explaining another configuration example of the semiconductor integrated circuit 1 according to this embodiment. In the semiconductor integrated circuit 1 according to this embodiment, as shown in FIG. 8, as ESD protection circuit 11' may be disposed at a central part of the winding L1 (the spiral inductor) of the transformer T1. In this case, in a manner similar to the above case, the ESD protection circuit 11' is connected to the center tap 12 of the winding L1 of the transformer T1 via a line 13'. Further, the ESD protection circuit 11' can be comprised of two diode groups D1 and D2 connected in parallel to each other, in which the diode groups D1 and D2 each include a plurality of diodes connected in multiple stages.

The terminals TM1 and TM2, the transformer T1, and the ESD protection circuit 11' as shown in FIG. 9 correspond to the actual sizes thereof. As explained above, in the semiconductor integrated circuit 1 according to this embodiment, the number of the ESD protection circuits can be one, and the number of stages of the diodes constituting the ESD protection circuit can be half that in the related art. Accordingly, the area of the ESD protection circuit can be sufficiently reduced. This enables the ESD protection circuit 11' to be disposed at the central part of the winding L1 (the spiral inductor) as shown in FIG. 9, thereby effectively utilizing a chip space.

As has been explained so far, in the semiconductor integrated circuit 1 according to this embodiment, as the ESD protection circuits 11 and 11' are connected to the center tap 12 of the winding L1 of the transformer T1, the number of the ESD protection circuits can be half that in the related art. Therefore, the semiconductor integrated circuit 1 can be miniaturized.

Second Embodiment

Figure 10:
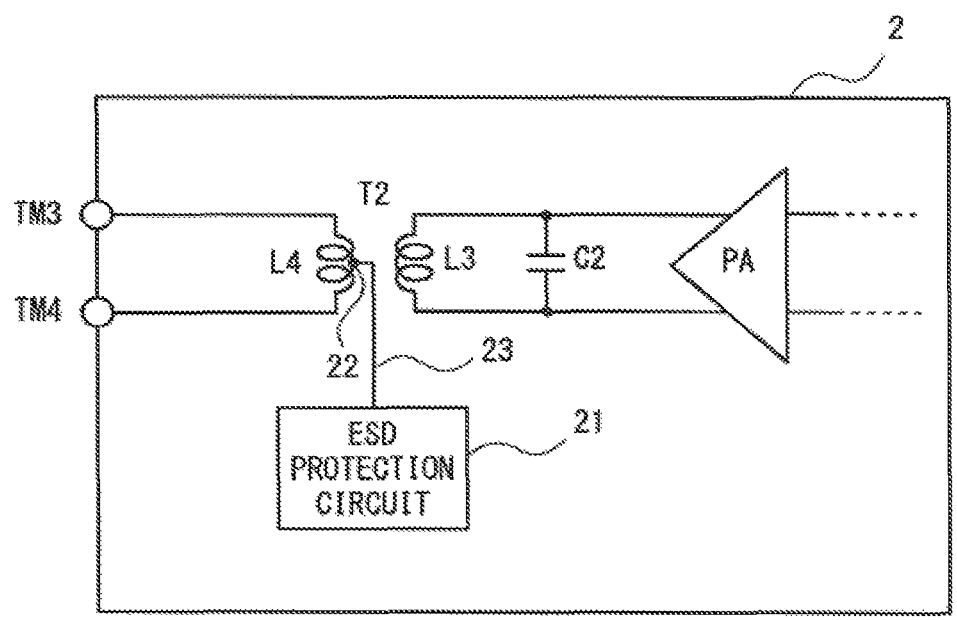
FIG. 10 is a circuit diagram showing an example of a semiconductor integrated circuit according to a second embodiment.

[Configuration of Semiconductor Integrated Circuit: FIG. 10]

Next, a second embodiment shall be explained as follows. FIG. 10 is a circuit diagram showing an example of a semiconductor integrated circuit 2 according to the second embodiment. A difference between the semiconductor integrated circuit 2 shown is FIG. 10 and the semiconductor integrated circuit 1 explained in the first embodiment is that the semiconductor integrated circuit 2 shown in FIG. 10 constitutes a transmitter circuit. As other configurations are the same as those in the semiconductor integrated circuit explained in the first embodiment, repeated explanations shall be omitted.

As shown in FIG. 10, the semiconductor integrated circuit 2 according to this embodiment includes a transformer T2 including terminals TM3 and TM4 and windings L3 and L4, a capacitive element C2, and a transmission amplifier circuit PA. These components are integrated into, for example, the RF-IC or RF-SoC. The semiconductor integrated circuit (a transmitter circuit) 2 according to this embodiment can be used for, for example, the semiconductor integrated circuit 113 (for transmissions in this case) that is included in the communication apparatus 101 shown in FIG. 2.

The transformer T2 and the capacitive element C2 function as an output impedance matching circuit for the transmission amplifier circuit PA. The capacitive element C2 may omitted depending on a value of an output impedance of the transmission amplifier circuit PA. Note that in FIG. 10, the transmitter circuit in the preceding stages of the transmission amplifier circuit PA are not shown. The transmitter circuit in the preceding stages of the transmission amplifier circuit PA is the same as that in the semiconductor integrated circuit 113 shown in FIG. 2.

As shown in FIG. 10, one end of the winding L4 of the transformer T2 is connected to the terminal TM3, and the other end of the winding L4 of the transformer 12 is connected to the terminal TM4. An output signal is supplied from the transformer T2 to the terminals TM3 and TM4. In ESD protection circuit 21 is a center tap 22 of the winding L4 of the transformer T2 via a line 23. Note that as the configurations of the terminals TM3 and TM4, the transformer T2, and the ESD protection circuit 21 are the same as those of the terminals TM1 and TM2, the transformer T1, and the ESD protection circuit 11 explained in the first embodiment, repeated explanations shall be omitted.

In this embodiment, in a manner similar to the above case, as the ESD protection circuit 21 is connected to the center tap 22 of the winding L4 of the transformer T2, the number of the ESD protection circuits 21 can be half (one) that in the related art. Thus, the semiconductor integrated circuit can be miniaturized.

Moreover, when a transmission signal (an RF signal) is output from one terminal TM3 to the antenna ANT, and the other terminal TM4 is grounded, an amplitude of a transmission signal applied to the ESD protection circuit 21 will become ½ of the amplitude of the transmission signal output from the terminal TM3. Accordingly, the number of diodes constituting the ESD protection circuit 11 can be reduced, the area of the ESD protection circuit 11 can be further reduced.

Further, when the amplitude of the reception signal applied to the ESD protection circuit 21 becomes ½, the same effect as the effect achieved when a parasitic impedance of the ESD protection circuit 21 is doubled can be achieved. As the ESD protection circuit 21 is connected in parallel to a signal path of an original transmission signal, the higher the parasitic impedance, the more reduction can be achieved in an increase of a loss caused by the parasitic impedance and in a deterioration of a frequency characteristic caused by the parasitic capacitance.

Third Embodiment

Figure 11:
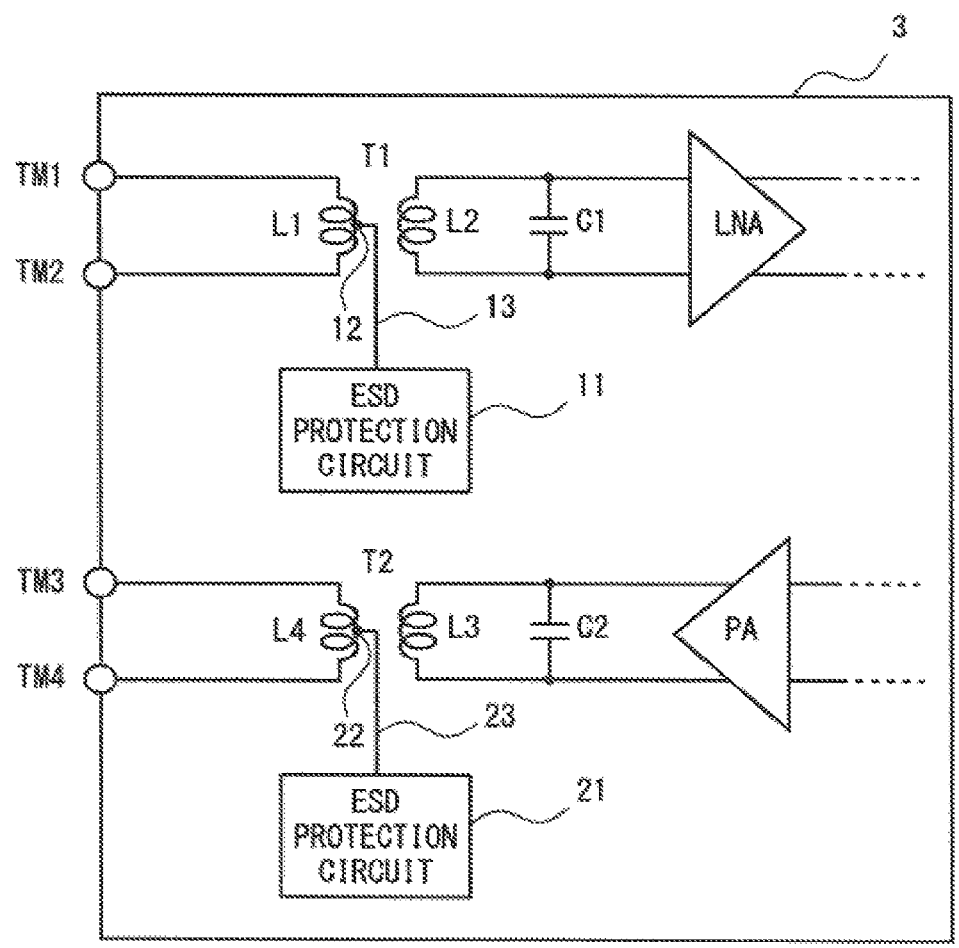
FIG. 11 is a circuit diagram showing an example of a semiconductor integrated circuit according to a third embodiment.

[Configuration of Semiconductor Integrated Circuit: FIG. 11]

Next, a third embodiment shall be explained as follows. FIG. 11 is a circuit diagram showing a semiconductor integrated circuit 3 according to the third embodiment. The semiconductor integrated circuit 3 shown in FIG. 11 forms a transceiver circuit. That is, the semiconductor integrated circuit 3 shown in FIG. 11 has a configuration combining the semiconductor integrated circuit 1 (the receiver circuit) explained in the first embodiment with the semiconductor integrated circuit 2 (the transmitter circuit) explained in the second embodiment.

As shown in FIG. 11, the semiconductor integrated circuit 3 includes the transformer T1 including the terminals TM1 and TM2 and the windings L1 and L2, the capacitive element C1, and the low-noise amplifier circuit LNA. The transformer T1 and the capacitive element C1 function as an input impedance matching circuit for the low-noise amplifier circuit LNA. The capacitive element C1 may be omitted depending on a value of an input impedance of the low-noise amplifier circuit LNA. Note that in FIG. 11, the receiver circuit in the subsequent stages of the low-noise amplifier circuit LNA are not shown.

As shown in FIG. 11, the one end of the winding L1 of the transformer T1 is connected to the terminal TM1, and the other end of the winding L1 of the transformer T1 is connected to the terminal TM2. A reception signal is supplied to the winding L1 of the transformer T1 via the terminals TM1 and TM2. The ESD protection circuit 11 is connected to the center tap 12 of the winding L1 of the transformer T1 via the line 13.

Further, the semiconductor integrated circuit 3 includes the transformer 12 including the terminals TM3 and TM4 and the windings L3 and 14, the capacitive element C2, and the transmission amplifier circuit PA. The transformer T2 and the capacitive element C2 function as an output impedance matching circuit for the transmission amplifier circuit PA. The capacitive element C2 may be omitted depending on a value of an output impedance of the transmission amplifier circuit PA. Note that in FIG. 11, the transmitter circuit in the preceding stages of the transmission amplifier circuit PA are not shown.

As shown in FIG. 11, the one end of the winding L4 of the transformer T2 is connected to the terminal TM3, and the other end of the winding L4 of the transformer T2 is connected to the terminal TM4. An output signal is supplied from the transformer T2 to the terminals TM3 and TM4. The ESD protection circuit 21 is connected to a center tap 22 of the winding L4 of the transformer T2 via the line 23.

These components shown in FIG. 11 are integrated into, for example, the RF-IC and RF-SoC. The semiconductor integrated circuit (the transceiver circuit) 3 according to this embodiment can be used for, for example, the semiconductor integrated circuit 113 that is included in the communication apparatus 101 shown in FIG. 2. Note that as details of the semiconductor integrated circuit 3 according to this embodiment are the same as those of the semiconductor integrated circuits 1 and 2 explained in the first and second embodiments, repeated explanations shall be omitted.

As in a manner similar to the above case, the semiconductor integrated circuit 3 according to this embodiment can be miniaturized.

Note that although a case in which the semiconductor integrated circuit according to this embodiment is applied to a smart meter has been explained above, the semiconductor integrated circuit according to this embodiment can be applied to an apparatus including a communication circuit other than a smart meter.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit comprising:
a first input terminal and a second input terminal to which a receiving signal is supplied;
a transformer that includes:
a first winding connected between the first and the second input terminals; and
a second winding;
a low-noise amplifier circuit that amplifies the receiving signal supplied from the second winding;
a capacitor element connected between both ends of the second winding; and
an ESD protection circuit that is electrically connected to a center tap of the first winding.

2. The semiconductor integrated circuit according to claim 1, wherein, in plan view, the ESD protection circuit is arranged between the first input terminal and the second input terminal.

3. The semiconductor integrated circuit according to claim 2, wherein
when a position at which lengths from the one end and another end of the first winding are equal is $P_M$, and a length from the one end to the other end of the first winding is L, the center tap is provided within a range of $\pm L \times 0.1$ from the position $P_M$.

4. The semiconductor integrated circuit according to claim 2, wherein
the first winding and the second winding included in the transformer are spiral inductors formed on a semiconductor substrate.

5. The semiconductor integrated circuit according to claim 4, wherein
the ESD protection circuit is comprised of a plurality of diodes connected in multiple stages formed on the semiconductor substrate.

6. The semiconductor integrated circuit according to claim 2, wherein
at least the transformer, the low-noise amplifier circuit, and the ESD protection circuit are integrated into one semiconductor chip.

7. The semiconductor integrated circuit according to claim 1, further comprising:
a first wiring connecting the first input terminal and one end of the first winding; and
a second wiring connecting the second input terminal and the other end of the first winding,
wherein the ESD protection circuit is arranged between the first wiring and the second wiring.

8. The semiconductor integrated circuit according to claim 7, wherein
when a position at which lengths from the one end and another end of the first winding are equal is $P_M$, and a length from the one end to the other end of the first winding is L, the center tap is provided within a range of $\pm L \times 0.1$ from the position $P_M$.

9. The semiconductor integrated circuit according to claim 7, wherein
the first winding and the second winding included in the transformer are spiral inductors formed on a semiconductor substrate.

10. The semiconductor integrated circuit according to claim 7, wherein
the ESD protection circuit is comprised of a plurality of diodes connected in multiple stages formed on the semiconductor substrate.

11. The semiconductor integrated circuit according to claim 7, wherein
at least the transformer, the low-noise amplifier circuit, and the ESD protection circuit are integrated into one semiconductor chip.

* * * * *